(12) United States Patent
Tu et al.

(10) Patent No.: US 8,735,919 B2
(45) Date of Patent: May 27, 2014

(54) GROUP III-NITRIDE BASED SEMICONDUCTOR LED

(75) Inventors: Po-Min Tu, Hsinchu (TW); Shih-Cheng Huang, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 252 days.

(21) Appl. No.: 13/304,414

(22) Filed: Nov. 25, 2011

(65) Prior Publication Data

US 2012/0205690 A1 Aug. 16, 2012

(30) Foreign Application Priority Data

Feb. 15, 2011 (CN) .......................... 2011 1 0037662

(51) Int. Cl.
*H01L 33/00* (2010.01)
(52) U.S. Cl.
USPC ................................... 257/94; 257/E33.034

(58) Field of Classification Search
USPC ........... 257/13, 14, 15, 79, 80, 82, 84, 94, 98, 257/E33.001, E33.073, E33.063, E33.068, 257/E31.003, E31.032, E33.027
See application file for complete search history.

(56) References Cited

U.S. PATENT DOCUMENTS

| | | | |
|---|---|---|---|
| 2002/0079502 A1* | 6/2002 | Ishibashi et al. | 257/89 |
| 2008/0123709 A1* | 5/2008 | Hersee | 372/45.011 |
| 2008/0251781 A1 | 10/2008 | Han et al. | |
| 2009/0283795 A1 | 11/2009 | Miki et al. | |
| 2010/0006876 A1* | 1/2010 | Moteki et al. | 257/95 |
| 2010/0044674 A1 | 2/2010 | Kim | |

* cited by examiner

*Primary Examiner* — Selim Ahmed
(74) *Attorney, Agent, or Firm* — Novak Druce Connolly Bove + Quigg LLP

(57) ABSTRACT

A group III-nitride based semiconductor LED includes a sapphire substrate, an n-type semiconductor layer, an active layer, and a p-type semiconductor layer grown sequentially on the sapphire substrate. An n-type strain lattice structure is arranged between the n-type semiconductor layer and the active layer. A lattice constant of the n-type strain lattice structure exceeds that of the active layer, and is less than that of the n-type semiconductor layer.

14 Claims, 4 Drawing Sheets

GROUP III-NITRIDE BASED SEMICONDUCTOR LED

BACKGROUND

1. Technical Field

The disclosure relates to light emitting diodes, and particularly to a group III-nitride based semiconductor LED.

2. Description of the Related Art

Light emitting diodes (LEDs) have many advantages, such as high luminosity, low operational voltage, low power consumption, compatibility with integrated circuits, easy driving, long term reliability, and environmental friendliness. These advantages have promoted the wide use of LEDs as a light source. Now, LEDs are commonly applied in environmental lighting.

Electrons and holes are recombined in the active region. A lattice mismatch between the semiconductor layer (i.e., n-GaN layer) and the active layer (InGaN/AlGaN MQW layer) must be considered. Such lattice mismatch reduces recombination rate of electrons and holes reduces. That limits quantum efficiency of the LEDs and reduces the luminescence of LEDs.

Therefore, it is desirable to provide a group III-nitride based semiconductor LED which can overcome the described limitations.

BRIEF DESCRIPTION OF THE DRAWINGS

Many aspects of the disclosure can be better understood with reference to the drawings. The components in the drawings are not necessarily drawn to scale, the emphasis instead being placed upon clearly illustrating the principles of the present group III-nitride based semiconductor LED which can overcome the described limitations. Moreover, in the drawings, like reference numerals designate corresponding parts throughout the views.

DETAILED DESCRIPTION

Embodiments of group III-nitride based semiconductor LED as disclosed are described in detail here with reference to the drawings.

Figure 1:
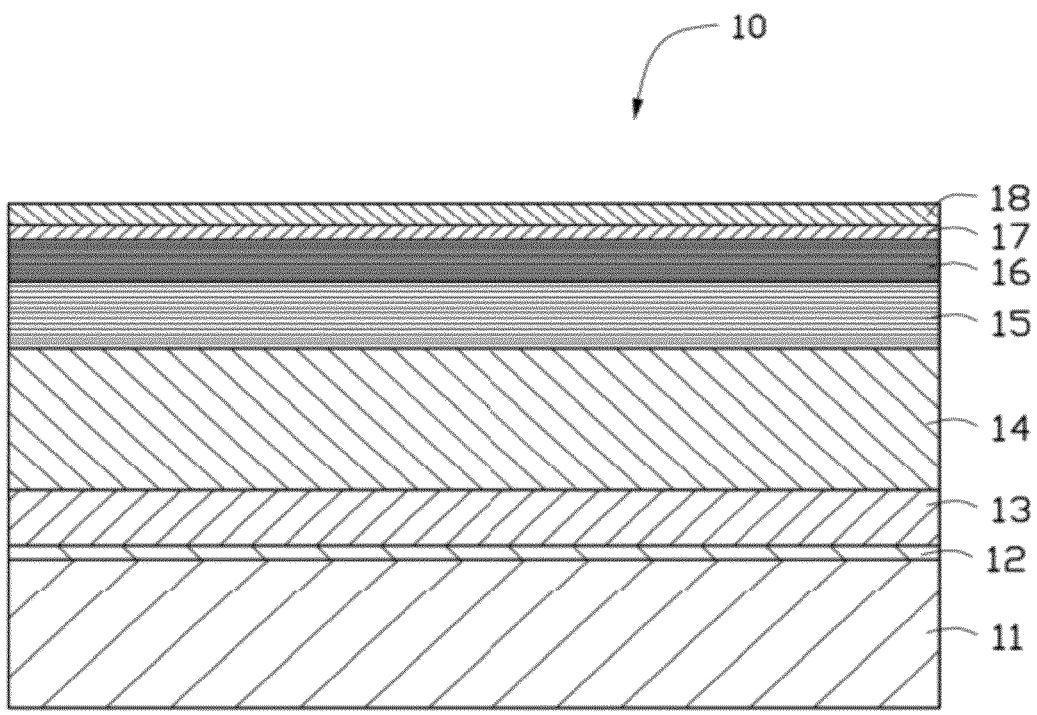
FIG. 1 is a cross-sectional view of a group III-nitride based semiconductor LED in accordance with a first embodiment.

Referring to FIG. 1, a group III-nitride based semiconductor LED 10 includes a sapphire substrate 11, an undoped GaN growing layer 12, an undoping GaN transitional layer 13, an n-type GaN layer 14, an n-type strain lattice structure 15, an $In_yGa_{1-y}N/Al_zGa_{1-z}N$ active layer 16, a p-type AlGaN layer 17, and a p-type GaN layer 18, and in that order. The p-type AlGaN layer 17 is used for an electronic barrier layer.

The $In_yGa_{1-y}N/Al_zGa_{1-z}N$ active layer 16 includes a trap layer $In_yGa_{1-y}N$ and a barrier layer $Al_zGa_{1-z}N$ arranging at two sides of the trap layer $In_yGa_{1-y}N$, wherein $0 \leq y \leq 1$; $0 \leq z \leq 1$.

The n-type strain lattice structure 15 is $(Al_xGa_{1-x}N\text{—}GaN)_m$, wherein $Al_xGa_{1-x}N$ layer and GaN layer are distributed alternatively, and $0 \leq x \leq 1$, m is number of layer. A thickness of the n-type strain lattice structure 15 exceeds 1 micrometer. Preferably, the thickness of the n-type strain lattice structure 15 is from about 2 micrometers to about 2.5 micrometers. A wavelength of light from the $In_yGa_{1-y}N/Al_zGa_{1-z}N$ active layer 16 can be adjusted according to x and n value.

Figure 2:
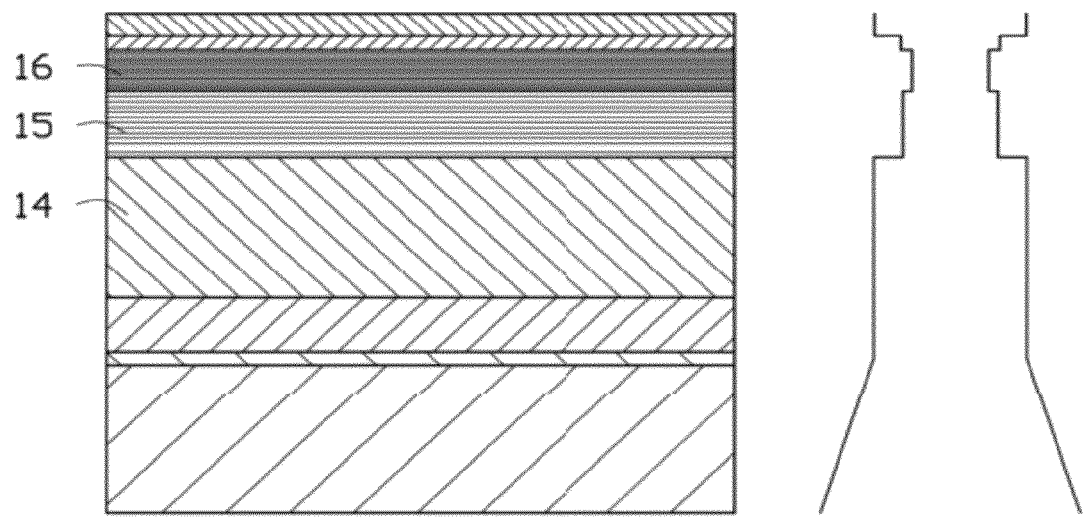
FIG. 2 is a cross-sectional view of the group III-nitride based semiconductor LED of FIG. 1 and a corresponding diagram indicating lattice constants of different layers of the semiconductor LED.

Referring to FIG. 2, a lattice constant of InN is greater than that of GaN. An energy gap of InN is less than that of GaN. A lattice constant of AlN is less than that of GaN. An energy gap of AlN is greater than that of GaN. Thus, an ingredient of the $(Al_xGa_{1-x}N\text{—}GaN)_m$ is selected by adjusting x and m value. The lattice constants of the n-type GaN layer 14, the n-type strain lattice structure 15, and the $In_yGa_{1-y}N/Al_zGa_{1-z}N$ active layer 16 are satisfied with a following equation: the lattice constant of the n-type GaN layer 14 ≥ the lattice constant of the n-type strain lattice structure 15 ≥ the lattice constant of the $In_yGa_{1-y}N/Al_zGa_{1-z}N$ active layer 16.

Thus, there is a gradually change lattice match between the n-type GaN layer 14 and the $In_yGa_{1-y}N/Al_zGa_{1-z}N$ active layer 16.

The $(Al_xGa_{1-x}N\text{—}GaN)_m$ is made by metal organic chemical vapor deposition (MOCVD).

A plurality of silicon impurity is doped into the n-type strain lattice structure 15, and a concentration of the silicon impurity is from $10^{17}$ EA/cm$^3$ to $10^{18}$ EA/cm$^3$. A plurality of Mg impurity is doped into the p-type AlGaN layer 17 and the p-type GaN 18. The concentration of the Mg impurity is from $10^{16}$ EA/cm$^3$ to $10^{17}$ EA/cm$^3$.

The $(Al_xGa_{1-x}N\text{—}GaN)_m$ can eliminate defects of the GaN layer 14. The $In_yGa_{1-y}N/Al_zGa_{1-z}N$ active layer 16 grows on the $(Al_xGa_{1-x}N\text{—}GaN)_m$. Thus, lattice mismatch between the $In_yGa_{1-y}N/Al_zGa_{1-z}N$ active layer 16 and the GaN layer 14 can be gradually decreased. The decreased mismatch reduces the defect scattering of carrier, absorption and scattering of light, and non-radiative transition center. Thus, that enhances luminescence.

Figure 3:
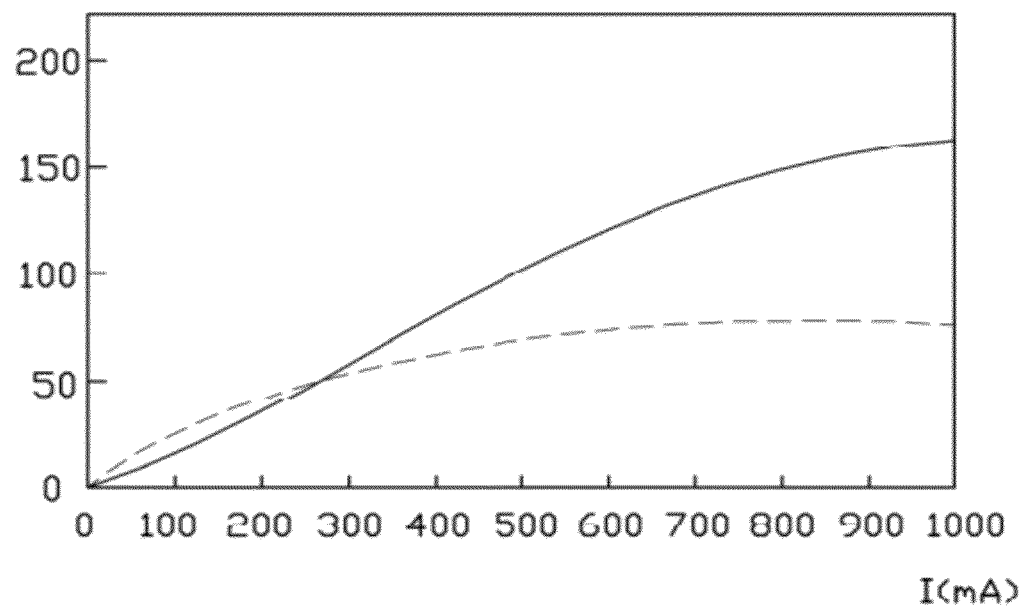
FIG. 3 is a current-luminous intensity curve diagram of the group III-nitride based semiconductor LED in this embodiment and prior art.

FIG. 3 shows a current-luminous intensity curve diagram of the group III-nitride based semiconductor LED 10 in this embodiment and prior art. The dotted line presents the group III-nitride based semiconductor LED of prior art. The solid line presents the group III-nitride based semiconductor LED 10 in this embodiment. When the current gradually increases, the proportion of increasing luminous intensity of the group III-nitride based semiconductor LED 10 in this embodiment exceeds that of prior art. The group III-nitride based semiconductor LED 10 usually is operated under 350 mA. When applying 350 mA into the group III-nitride based semiconductor LED 10 and prior art, the proportion of increasing luminous intensity of the group III-nitride based semiconductor LED 10 exceeds that of prior art.

Figure 4:
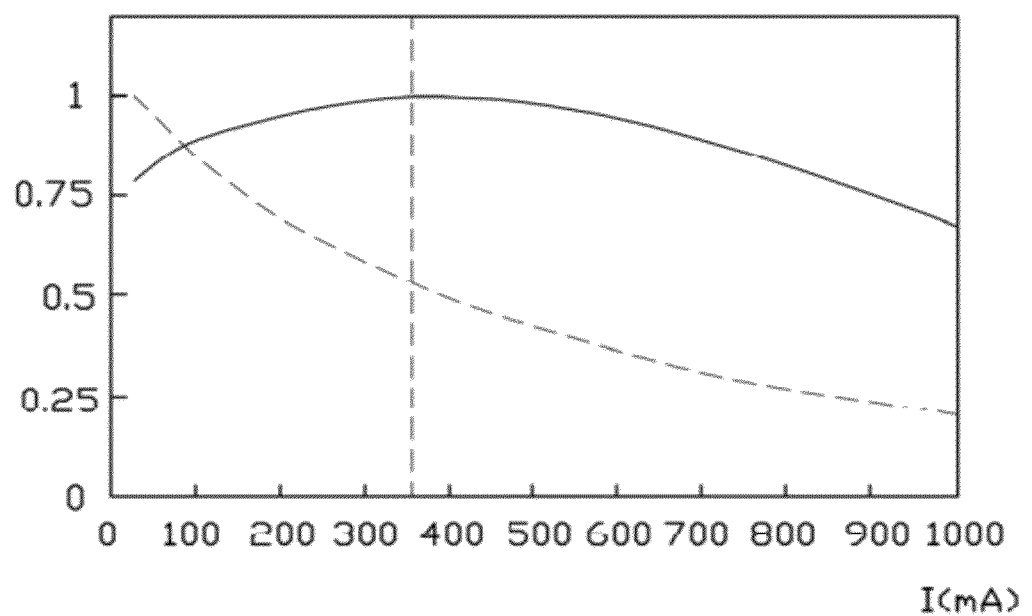
FIG. 4 is a current-power curve diagram of the group III-nitride based semiconductor LED in this embodiment and prior art.

FIG. 4 shows a current-power curve diagram of the group III-nitride based semiconductor LED 10 in this embodiment and prior art. The dotted line presents the group III-nitride based semiconductor LED of prior art. The solid line presents the group III-nitride based semiconductor LED 10 in this embodiment. When applying 350 mA into the group III-nitride based semiconductor LED 10 and prior art, the proportion of power droop of the group III-nitride based semiconductor LED 10 is lower than that of prior art.

The only difference between the group III-nitride based semiconductor LED 10 in a second embodiment and the first embodiment is that the n-type strain lattice structure 15 is $(Al_xGa_{1-x}N\text{—}Al_kGa_{1-k}N)_m$, wherein $Al_xGa_{1-x}N$ and $Al_kGa_{1-k}N$ are distributed alternatively and $0 \leq x \leq 1$; $0 \leq k \leq 1$. A thickness of the $(Al_xGa_{1-x}N\text{—}Al_kGa_{1-k}N)_m$ exceeds 1 micrometer. Preferably, the thickness of the $(Al_xGa_{1-x}N\text{—}Al_kGa_{1-k}N)_m$ is from 2 to 2.5 micrometers.

While the disclosure has been described by way of example and in terms of exemplary embodiment, it is to be understood that the disclosure is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A group III-nitride based semiconductor LED, comprising: a sapphire substrate, an n-type semiconductor layer, an active layer, and a p-type semiconductor layer are sequentially grown on the sapphire substrate, wherein an n-type strain lattice structure is grown between the n-type semiconductor layer and the active layer, a lattice constant of the n-type strain lattice structure exceeds that of the active layer, and less or equal to that of the n-type semiconductor layer, wherein the n-type strain lattice structure is $(Al_xGa_{1-x}N—GaN)_m$, $Al_xGa_{1-x}N$ layer and GaN layer are distributed alternatively, $0 \leq x \leq 1$, and m is number of layer.

2. The group III-nitride based semiconductor LED of claim 1, wherein the n-type semiconductor layer is an n-type GaN layer, the active layer is $In_yGa_{1-y}N/Al_zGa_{1-z}N$, the p-type semiconductor layer is p-type AlGaN layer and p-type GaN layer, and $0 \leq y \leq 1$, $0 \leq z \leq 1$.

3. The group III-nitride based semiconductor LED of claim 1, wherein an undoped GaN layer, an undoped GaN transitional layer are sequentially grown on the sapphire structure, and the n-type semiconductor layer is grown on the undoped GaN transitional layer.

4. The group III-nitride based semiconductor LED of claim 1, wherein a p-type GaN layer is grown on the p-type semiconductor layer.

5. The group III-nitride based semiconductor LED of claim 1, wherein a thickness of the n-type strain lattice structure is from 2 to 2.5 micrometers.

6. The group III-nitride based semiconductor LED of claim 1, wherein the n-type strain lattice structure is grown by metal organic chemical vapor deposition.

7. The group III-nitride based semiconductor LED of claim 1, wherein the n-type strain lattice structure is doped with silicon impurity, and the p-type semiconductor is doped with p-type impurity.

8. A group III-nitride based semiconductor LED, comprising: a sapphire substrate, an n-type semiconductor layer, an active layer, and a p-type semiconductor layer are sequentially grown on the sapphire substrate, wherein an n-type strain lattice structure is grown between the n-type semiconductor layer and the active layer, a lattice constant of the n-type strain lattice structure exceeds that of the active layer, and less or equal to that of the n-type semiconductor layer, wherein the n-type strain lattice structure is $(Al_xGa_{1-x}N—Al_kGa_{1-k}N)_m$, $Al_xGa_{1-x}N$ and $Al_kGa_{1-k}N$ are distributed alternatively, $0 \leq x \leq 1$; $0 \leq k \leq 1$, and m is number of layer.

9. The group III-nitride based semiconductor LED of claim 8, wherein the n-type semiconductor layer is an n-type GaN layer, the active layer is $In_yGa_{1-y}N/Al_zGa_{1-z}N$, the p-type semiconductor layer is p-type AlGaN layer and p-type GaN layer, and $0 \leq y \leq 1$, $0 \leq z \leq 1$.

10. The group III-nitride based semiconductor LED of claim 8, wherein an undoped GaN layer, an undoped GaN transitional layer are sequentially grown on the sapphire structure, and the n-type semiconductor layer is grown on the undoped GaN transitional layer.

11. The group III-nitride based semiconductor LED of claim 8, wherein a p-type GaN layer is grown on the p-type semiconductor layer.

12. The group III-nitride based semiconductor LED of claim 8, wherein a thickness of the n-type strain lattice structure is from 2 to 2.5 micrometers.

13. The group III-nitride based semiconductor LED of claim 8, wherein the n-type strain lattice structure is grown by metal organic chemical vapor deposition.

14. The group III-nitride based semiconductor LED of claim 8, wherein the n-type strain lattice structure is doped with silicon impurity, and the p-type semiconductor is doped with p-type impurity.

* * * * *